(12) United States Patent
Chiang (10) Patent No.: US 7,332,394 B2
(45) Date of Patent: Feb. 19, 2008

(54) METHOD TO REDUCE A CAPACITOR DEPLETION PHENOMENA

(75) Inventor: Min-Hsiung Chiang, Banciao (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 319 days.

(21) Appl. No.: 11/264,447

(22) Filed: Nov. 1, 2005

(65) Prior Publication Data

US 2006/0057803 A1    Mar. 16, 2006

Related U.S. Application Data

(62) Division of application No. 10/754,835, filed on Jan. 9, 2004, now abandoned.

(51) Int. Cl.
*H01L 21/8242* (2006.01)

(52) U.S. Cl. .......... 438/246; 438/243; 257/E21.396

(58) Field of Classification Search .......... None
See application file for complete search history.

(56) References Cited

U.S. PATENT DOCUMENTS 6,420,226 B1    7/2002    Chen et al. .......... 438/238
6,555,430 B1    4/2003    Chudzik et al. .......... 438/243
6,661,043 B1    12/2003   Huang et al. .......... 257/243
2002/0094697 A1   7/2002  Leung et al. .......... 438/766
2004/0191985 A1*  9/2004  Tu .......... 438/244

* cited by examiner

*Primary Examiner*—A. Sefer
*Assistant Examiner*—Kevin Quinto
(74) *Attorney, Agent, or Firm*—Thomas, Kayden, Horstemeyer & Risley

(57) ABSTRACT

A method of integrating the fabrication of a capacitor cell and a logic device region, wherein the surface area of a capacitor region is increased, and the risk of a capacitor depletion phenomena is reduced, has been developed. After formation of insulator filled STI regions featuring tapered sides, a portion of the insulator layer in an STI region is recessed below the top surface of the semiconductor substrate exposing a bare, tapered side of the semiconductor substrate. Ion implantation into the tapered side of the portion of semiconductor substrate exposed in the recessed STI portion, as well as into a top portion of semiconductor substrate located adjacent to the recessed STI portion, results in formation of a capacitor region now greater in surface area than a counterpart capacitor region which is formed via implantation into only a top portion of semiconductor substrate. Growth of a gate insulator layer and definition of gate structures in the logic device region, also simultaneously forms a capacitor dielectric layer on the underlying capacitor region, as well as a capacitor plate structure in the capacitor cell region.

18 Claims, 6 Drawing Sheets

METHOD TO REDUCE A CAPACITOR DEPLETION PHENOMENA

CROSS-REFERENCE TO RELATED APPLICATION

This application is a divisional of U.S. patent application Ser. No. 10/754,835, filed Jan. 9, 2004 now abandoned.

BACKGROUND OF THE INVENTION (1) Field of the Invention

The present invention relates to methods used to fabricate semiconductor devices, and more specifically to a method used to improve the integrity of a capacitor device.

(2) Description of Prior Art

The advent of micro-miniaturization, or the ability to fabricate semiconductor devices featuring sub-micron features, has allowed device fabrication costs to be reduced while also allowing the performance of these same devices to be increased. Advances in specific semiconductor fabrication disciplines such as photolithographic and dry etching has enabled smaller device features to be routinely obtained, thus allowing decreases in unwanted performance degrading capacitances to be realized. In addition integrated fabrication of specific elements such as capacitor structures, along with other semiconductor logic components have allowed process costs to be reduced. To minimize the number of cost consuming photolithographic procedures needed for the integration of a capacitor cell in a logic type process sequence, care must be used to adequately fabricate key capacitor features. If specific photolithographic masking steps directed at exposing areas wherein capacitor regions will be formed via ion implantation procedures are marginalized, inadequate formation of the capacitor region will occur resulting in a capacitor depletion phenomena deleteriously influencing capacitor cell performance.

The present invention will describe a process in which the formation of a capacitor cell is integrated into a logic device fabrication process flow, wherein only one photolithographic masking step is used to define a capacitor cell, thus requiring no additional photolithographic steps. The disclosed fabrication sequence insures the integrity of the capacitor cell, reducing a capacitor depletion phenomena which can occur with other integrated process sequences not using this present invention. Prior art such as attorney docket No. TS01-1579/1580/284, filed Mar. 27, 2003, Ser. No. 10,400,401, as well as published U.S. patent application No. 20020094697, filed Nov. 2, 2001, Ser. No. 10/033,690, describe methods of forming capacitor cells, and of integrating the fabrication of the capacitor cell with the formation of logic devices. However these prior art do not employ the novel process steps and sequence featured in the present invention.

SUMMARY OF THE INVENTION

It is an object of this invention to integrate the fabrication of a capacitor cell into a logic device process sequence.

It is another object of this invention to form a capacitor region with less risk of a capacitor depletion phenomena via implantation of the capacitor region in tapered silicon sidewall, exposed in a recessed portion of a shallow trench isolation (STI) structure.

It is still another object of this invention to increase the capacitance of the capacitor cell via an increase in capacitor are via use of the tapered silicon side wall exposed in a recessed portion of an STI structure.

In accordance with the present invention a method of integrating the fabrication of a capacitor cell in a logic device process sequence featuring increased capacitor area and reduced risk of a capacitor depletion phenomena, via implantation of a capacitor region into a tapered silicon side wall exposed in an STI structure, will now be described in detail. After definition of shallow trench shapes in an insulator hard mask layer, as well as in top portions of a semiconductor substrate wherein the shallow trench shapes feature tapered side walls, an insulator liner layer is formed on all exposed surfaces of the shallow trench shapes. Deposition of another insulator layer results in insulator filled, shallow trench isolation (STI) structures. Photolithographic and dry etching procedures define an capacitor area in a portion of the semiconductor substrate to be used to accommodate a capacitor cell, accomplished via recessing of a top portion of the insulator layer in the STI structures, as well removal of exposed portions of the liner layer resulting in exposure of tapered silicon side walls. A capacitor region is next formed via implantation of specific ions into the tapered silicon side walls, and into a semiconductor region located underlying the insulator hard mask layer, adjacent to the recessed portion of the STI structure. After removal of the insulator hard mask layer a capacitor dielectric layer is formed on the surfaces of the capacitor region, the exposed tapered silicon side walls in the recessed portion of the STI structure, and a top portion of semiconductor region located adjacent to the recessed portion of the STI structure. The same capacitor dielectric layer is formed as a gate insulator layer in a logic device region. A conductive layer is deposited and patterned to define a capacitor plate structure as well as transfer gate structures in the capacitor cell region, and to define gate structures in the logic device region. Lightly doped source/drain (LDD) regions, insulator side wall spacers, and heavily doped source/drain regions are then formed in logic device region as well as in the capacitor cell region, allowing the path for the capacitance to be accessed.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
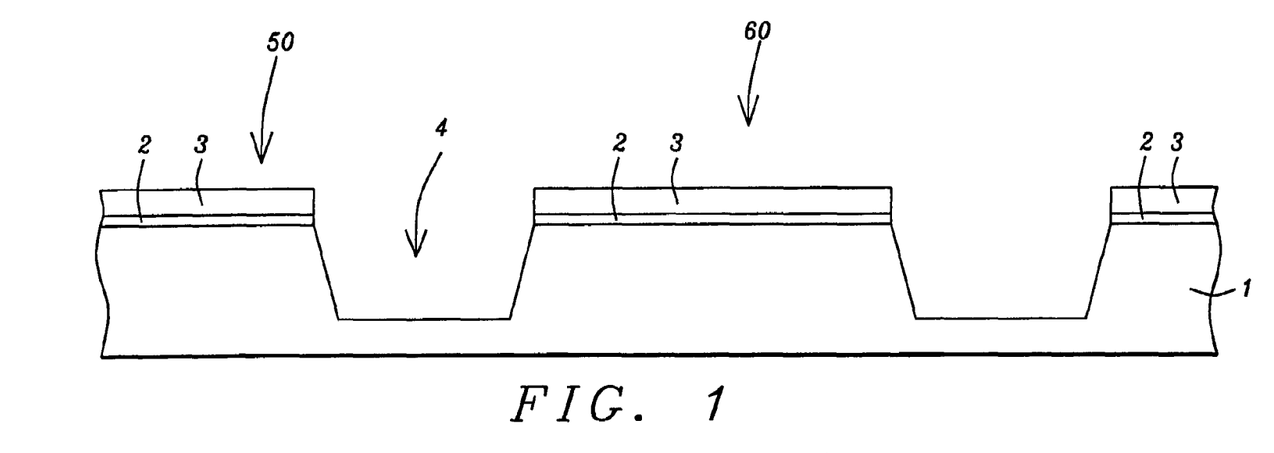
FIGS. 1-10, which schematically, in cross-sectional style, describe key stages used to integrate the fabrication of a capacitor cell in a logic process sequence, wherein increased capacitor area and reduced risk of a capacitor depletion phenomena are realized via implantation of a capacitor region into a tapered silicon side wall exposed in an STI structure.

The method of integrating the fabrication of a capacitor cell in a logic process sequence wherein increased capacitor area and reduced risk of a capacitor depletion phenomena are realized via implantation of a capacitor region into a tapered silicon side wall exposed in an STI structure, will now be described in detail. Semiconductor substrate 1, comprised of P type single crystalline silicon, featuring a <100> crystallographic orientation, is used and schematically shown in FIG. 1. The fabrication of a capacitor cell will be shown in region 60 of semiconductor substrate 1, integrated with the fabrication of logic devices in region 50 of semiconductor substrate 1. Pad oxide layer 2, comprised of silicon oxide is formed at a thickness between about 50 to 300 Angstroms, on the surface of semiconductor substrate 1, via thermal oxidation procedures, or via low pressure chemical vapor deposition (LPCVD) or plasma enhanced chemical vapor deposition (LPCVD) procedures. Silicon nitride layer 3 is next deposited at a thickness between about 500 to 2500 Angstroms, again employing via LPCVD or PECVD procedures. A photoresist shape, not shown in the drawings, is next used as an etch mask to allow definition of shallow trench shapes 4 to be realized via reactive ion etching (RIE) procedures. Definition of the openings in the hard mask layer comprised of silicon nitride layer 3 and silicon oxide layer 2, is accomplished via a RIE procedure using $CF_4$ or $Cl_2$ as an etchant for silicon nitride while using $CHF_3$ as an etchant for silicon oxide. After definition of the desired shape in the hard mask layer the RIE procedure is continued using $Cl_2$ or $SF_6$ as a etchant for silicon resulting in the definition of shallow trench openings 4. Shallow trench openings 4 are formed in semiconductor substrate 1 to a depth between about 2500 to 5000 Angstroms. The RIE conditions also feature an isotropic component allowing tapering of the sides of each shallow trench opening to be realized. The tapered sides, in which a subsequent capacitor region will be implanted into, is formed at an angle between about 70 to 89°, in relation to the horizontal top surface of semiconductor substrate 1. The result of these procedures is schematically shown in FIG. 1.

Figure 2:
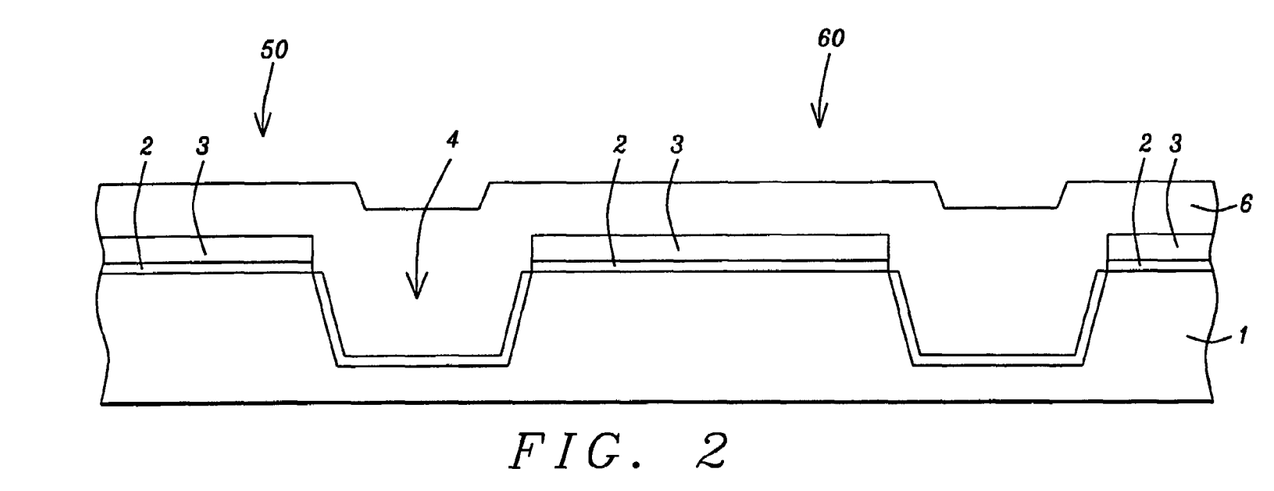

Silicon oxide layer 5, to be used as a liner layer, is next formed at a thickness between about 50 to 300 Angstroms on all surfaces of shallow trench shapes 4, via thermal oxidation procedures. High density plasma (HDP) silicon oxide layer 6 is next deposited via chemical vapor deposition procedures to a thickness between about 4000 to 8000 Angstroms, completely filling shallow trench openings 4, while also overlying the hard mask layer. This is schematically shown in FIG. 2.

Figure 3:
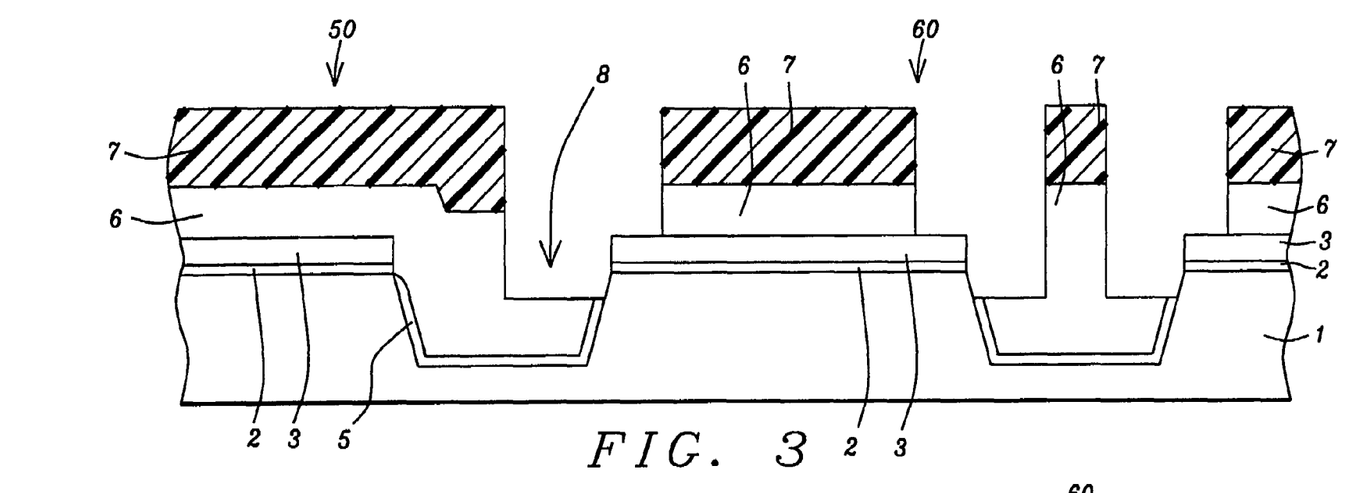

Capacitor patterning is next addressed using only one photolithographic procedure to define recesses 8 in silicon oxide filled shallow trench shapes 4, wherein recesses 8 will subsequently allow a capacitor region to be formed in a portion of the semiconductor substrate through exposed tapered sides of silicon oxide filled shallow trench shapes 4. After definition of photoresist shape 7 a selective RIE procedure, performed using $CHF_3$ as an etchant for HDP silicon oxide layer 6 as well as for silicon oxide liner layer 5, is used to form recesses 8 to a depth between about 1000 to 3500 Angstroms in silicon oxide filled shallow trench shapes 4, and in silicon oxide liner layer 5, exposing a top portion of the tapered sides of shallow trench shapes 4. In addition portions of HDP silicon oxide layer 6, located on silicon nitride layer 3, exposed in openings in photoresist shape 7, and located adjacent to the recessed portion of oxide filled shallow trench shapes 4, are also selectively removed via the selective RIE procedure. This is schematically shown in FIG. 3.

Figure 4:
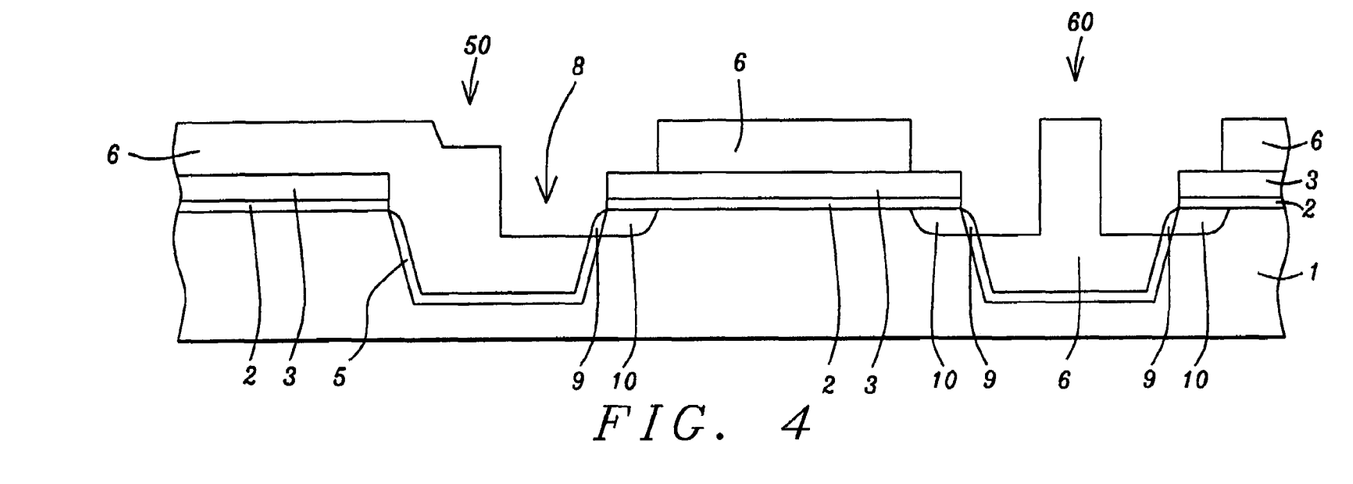

After removal of photoresist shape 7, via plasma oxygen ashing procedures, silicon oxide layer 9, to be used as a screen oxide layer for a subsequent ion implantation procedure, is formed on the exposed tapered sides in recesses 8 at a thickness between about 50 to 300 Angstroms via thermal oxidation procedures. A critical ion implantation procedure is next performed at an energy sufficient to form capacitor region in portions of semiconductor substrate 1 underlying the silicon nitride-silicon oxide hard mask layer. In addition the same ion implantation procedure is able to implant capacitor region ions through screen oxide layer 9 located on the tapered sides of semiconductor substrate 1. Capacitor region 10 formed as a result of this implantation features increased surface area enhancing capacitor performance, and less risk of a capacitor depletion phenomena as a result of the portion of capacitor region formed along the tapered sides of recesses 8. The implantation procedure used to form capacitor region 10 is performed using boron or $BF_2$ ions, at an energy between about 3 to 30 KeV, at a dose between about 1E13 to 5E13 atoms/$cm^2$, using an implant angle between about 0 to 30°. Region 50 of semiconductor substrate 1, to be used for logic devices, was protected from the capacitor region ion implantation procedure by unremoved portions of HDP silicon oxide layer 6. Thus the capacitor region was defined using only one photolithographic procedure, the procedure used to form recesses 8 in silicon oxide filled shallow trench shapes 4. The result of the above procedures is schematically shown in FIG. 4.

Figure 5:
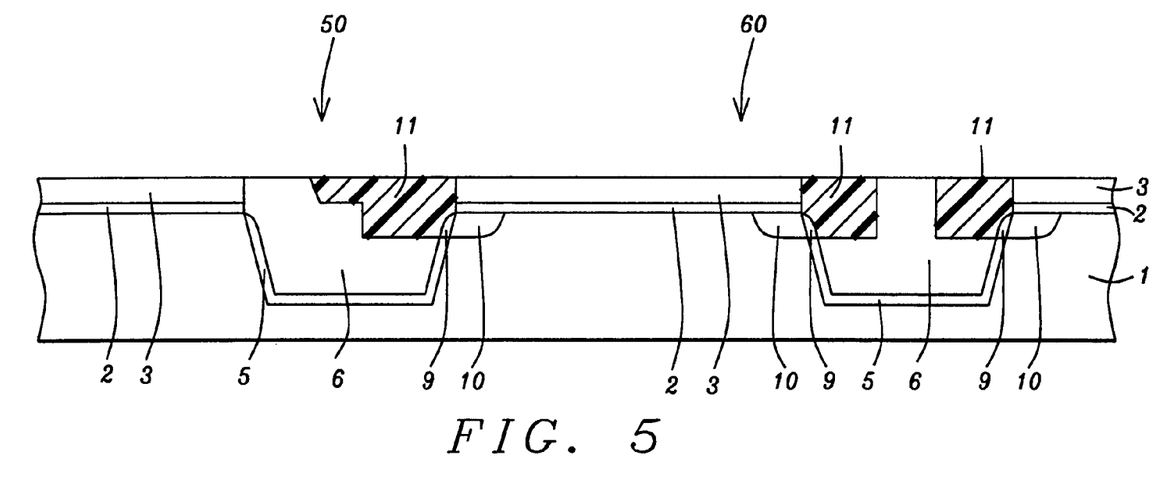
Figure 6:
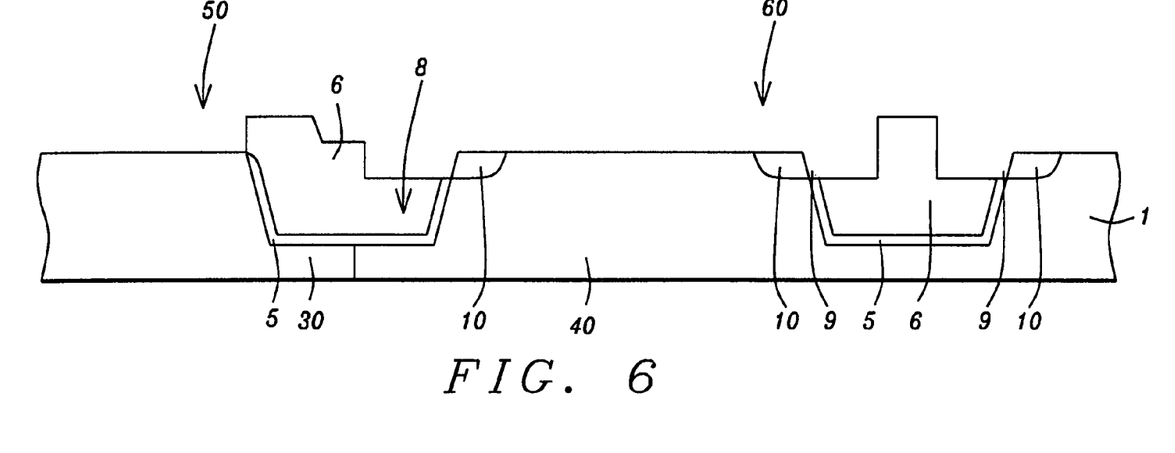

Removal of the hard mask layer comprised of silicon nitride layer 3 and silicon oxide layer 2, is next addressed and schematically described using FIGS. 5-6. Photoresist layer 11 is applied then subjected to a chemical mechanical polishing (CMP) procedure to fill recesses 8, with the CMP planarization procedure terminating at the appearance of the top surface of the hard mask layer. If desired photoresist layer can be replaced by other organic layers such as a bottom anti-reflective coating (BARC) layer. In addition if desired the CMP procedure can be replaced by a selective dry etch procedure using oxygen as an etchant for the organic material. The result of the CMP planarization procedure is schematically shown in FIG. 5. Silicon nitride layer 3 is next selectively removed either via wet procedures using hot phosphoric acid or via dry etch procedures using $CF_4$ or $Cl_2$ as a selective etchant for silicon nitride. Silicon oxide layer 2 is next removed, again either via wet etch procedures using a buffered hydrofluoric acid solution or via a dry etch procedure using $CHF_3$ as an etchant. Removal of silicon oxide layer 2 also results in the removal of screen oxide layer 9, exposed on the tapered sides of the STI region. Exposure of portions of the top surface of semiconductor substrate 1, in both capacitor cell region 60 as well as in logic device region 50, as a result of the above procedures is schematically shown in FIG. 6.

Formation of well region 30 in logic device region 50, and of well region 40 in capacitor cell region 60, is next addressed. A photoresist shape, not shown in the drawings, is used to protect capacitor cell region 60 from ion implantation procedures used to form either P type or N type well regions 30, to be used to accommodate either N channel or P channel, metal oxide semiconductor field effect transistor (MOSFET) devices. After removal of the photoresist shape overlying capacitor cell region 60, another photoresist shape is formed to protect logic device region 50 from an ion implantation procedure used to form either P type or N type well region 40, in capacitor cell region 60. A sacrificial or screen oxide layer may be formed prior to, then removed after, the well implantation procedures. The formation of the well regions is schematically shown in FIG. 6.

Figure 7:
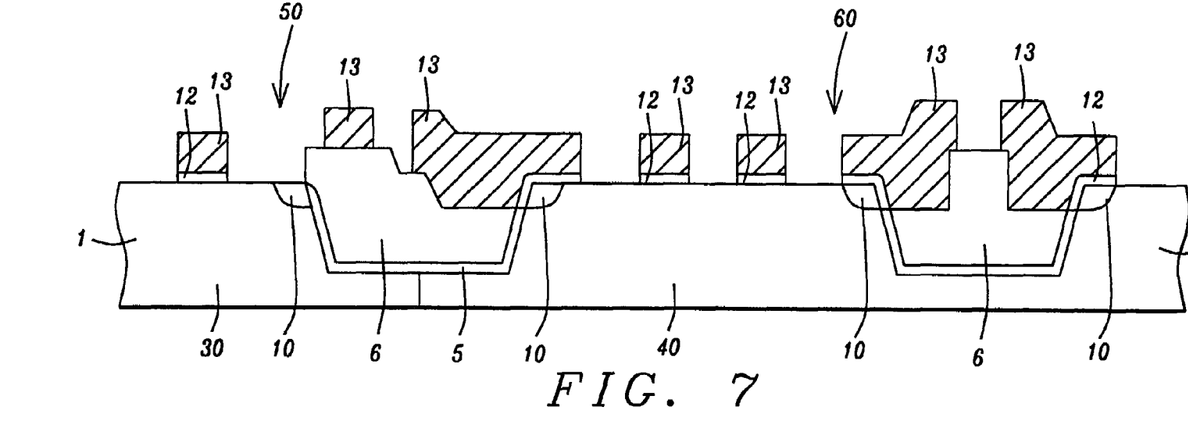

After removal of the photoresist shapes used for well formation silicon dioxide layer 12, is formed via thermal oxidation procedures at a thickness between about 10 to 100 Angstroms. Silicon dioxide layer 12, to be used as a gate insulator layer in logic device region 30, is formed on exposed top surfaces of semiconductor substrate 1 in logic device region 30. Silicon dioxide layer 12 will also be used as a capacitor dielectric layer in capacitor cell region 40, on the exposed surfaces of capacitor region 10, including the bare tapered sides of capacitor region 10. A conductive layer, such as doped polysilicon, is next deposited via LPCVD procedures to a thickness between about 1000 to 2500 Angstroms. The polysilicon layer can be doped in situ during deposition via the addition of arsine or phosphine to a silane ambient, or the polysilicon layer can be deposited intrinsically then doped via implantation of arsenic or phosphorous ions. A photoresist shape, not shown in the drawings, is next used as a mask to allow gate structures 13, to be defined via a selective anisotropic RIE procedure using either Cl$_2$ or SF$_6$ as an etchant for polysilicon. The RIE procedure selectively terminates at the appearance of silicon dioxide gate insulator layer 12, or at the appearance of HDP silicon oxide layer 6. Removal of the photoresist shape used to define gate structures 13, is accomplished via plasma oxygen ashing and careful wet cleans, with a buffered hydrofluoric acid cycle used as a component of the wet clean procedure resulting in removal of the portions of silicon dioxide layer 12 not protected by gate structures 13. The polysilicon structure located on silicon dioxide, capacitor dielectric layer 12, in capacitor cell region 60, will perform as a capacitor plate structure. The result of these procedures is schematically shown in FIG. 7.

Figure 8:
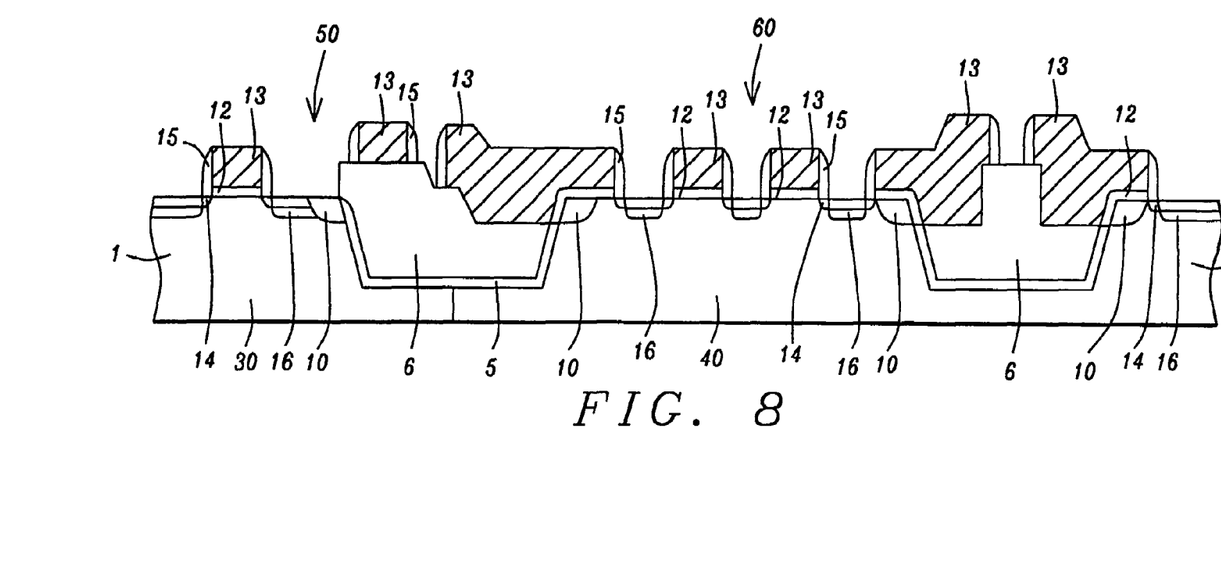

Lightly doped source/drain (LDD) regions 14 are next formed in portions of semiconductor substrate 1 not covered by gate structures 13, or occupied by silicon oxide filled shallow trench shapes 4. LDD regions 14 are formed, via implantation of arsenic, phosphorous or boron ions, at an energy between about 2 to 5 KeV, and at a dose between about 1E14 to 5E15 atoms/cm$^2$. An insulator layer such as silicon oxide or silicon nitride, is next deposited via LPCVD or PECVD procedures at a thickness between about 300 to 1000 Angstroms. An anisotropic RIE procedure, performed using either CHF$_3$, CF$_4$, or Cl$_2$ is next used to form insulator spacers 15, on the sides of gate structures 13. This is followed by formation of heavily doped source/drain region 16, in portions of semiconductor substrate 1, not covered by gate structures 13, or by insulator spacers 15, or occupied by silicon oxide filled shallow trench shapes 4, via implantation of arsenic, phosphorous or boron ions, at an energy between about 5 to 60 KeV, and at a dose between about 1E14 to 8E15 atoms/cm$^2$. The result of these procedures is schematically shown in FIG. 8.

Figure 9:
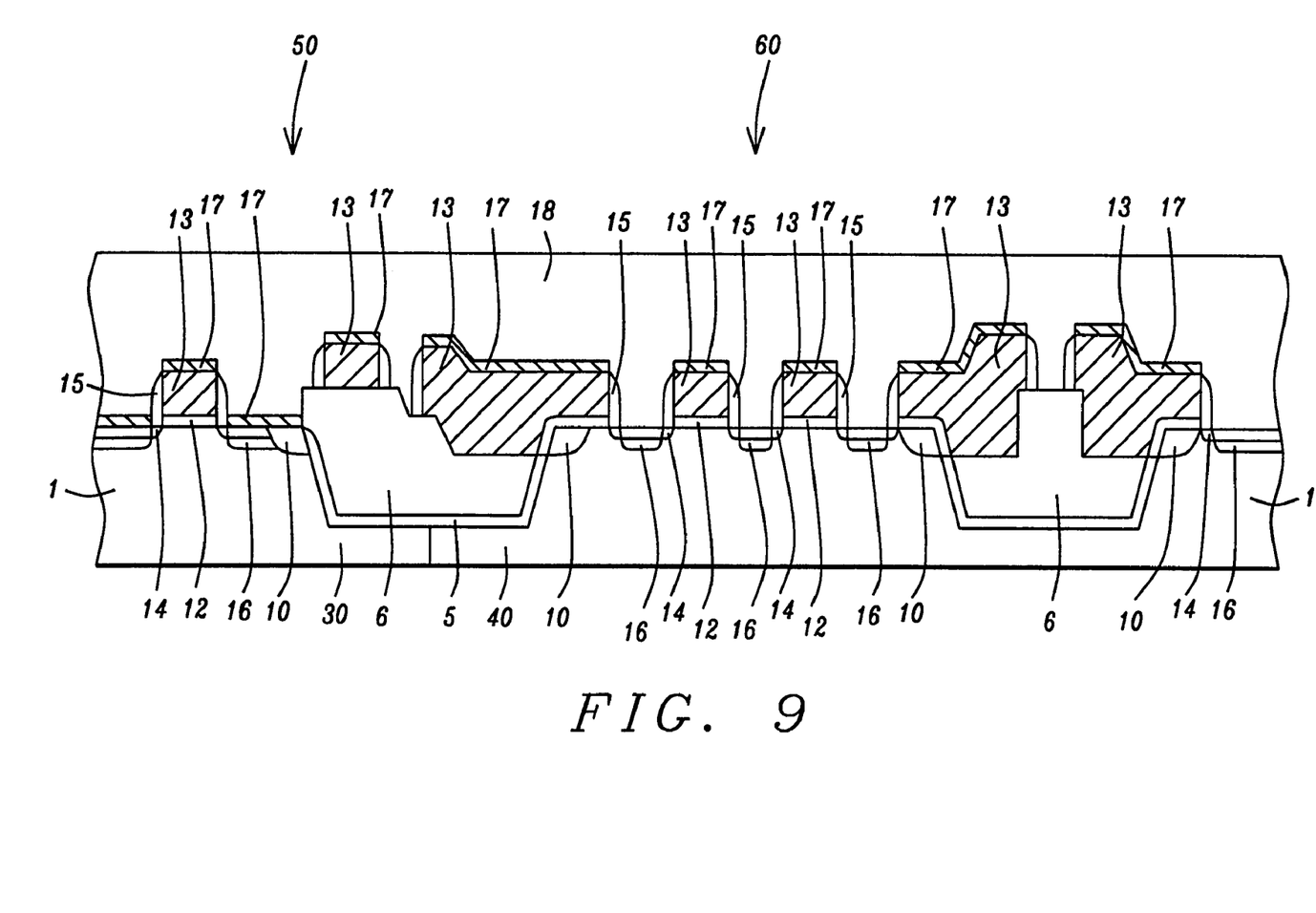

Metal silicide layer 17 is next selectively formed on the top surface of all gate structures and on the top surface of all heavily doped source/drain regions. This is accomplished via plasma vapor deposition of a metal layer such as titanium, tantalum, nickel, cobalt, or zirconium, at a thickness between about 50 to 500 Angstroms. An anneal procedure such as a rapid thermal anneal (RTA) procedure, is next performed at a temperature between about 450 to 900° C., in an inert ambient resulting in formation of metal silicide layer 17, a layer such as titanium silicide, tantalum silicide, nickel silicide, cobalt silicide, or zirconium silicide, formed on the top surface of gate or capacitor plate structures as well as on the heavily doped source/drain regions. The metal layer remains unreacted on non-conductive surfaces such as insulator spacers 15, or HDP silicon oxide layer 6. The unreacted metal is then selectively removed via wet etch procedures. Metal silicide formation on the storage node area is optional, with metal silicide being used for some high speed cases. Interlevel dielectric (ILD) layer 18, comprised of either silicon oxide, boro-phosphosilicate glass (BPSG), or a fluorinated silica glass (FSG), is next deposited via PECVD or via high density plasma (HDP) procedures at a thickness between about 4,000 to 10,000 Angstroms. A CMP procedure is next used to planarize BPSG layer 18. The result of these procedures is schematically shown in FIG. 9.

Figure 10:
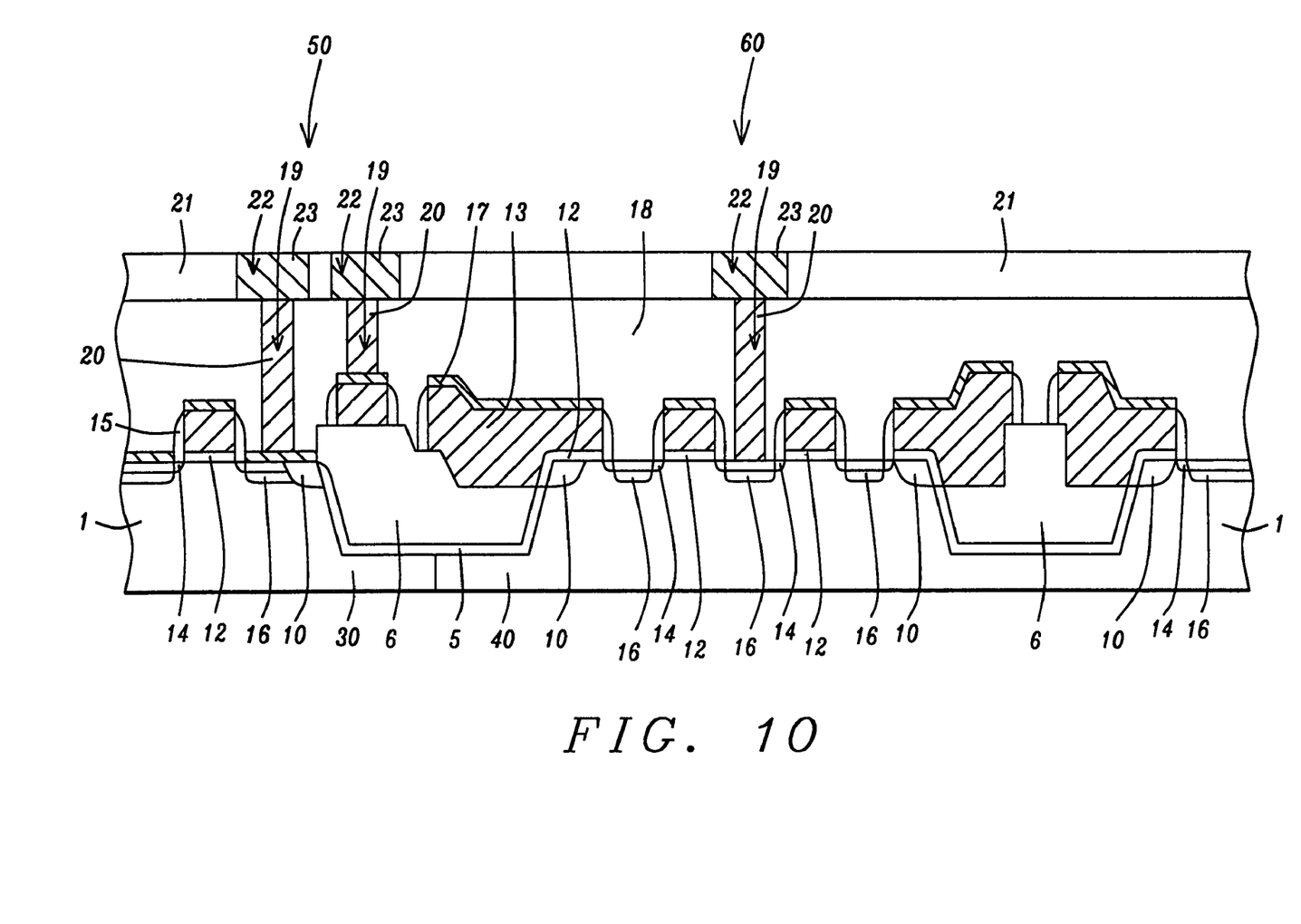

Photolithographic and dry etching procedures are next employed to open via hole 19 in ILD layer 18, exposing heavily doped source/drain region 19 in capacitor cell region 60, which will be used to accommodate a subsequent bit line structure. Additional via holes are defined in ILD layer 18 during the above procedure, to be used to accommodate subsequent capacitor plate pick up structures, or to accommodate subsequent word and bit line structures in logic device region 50. After removal of the photoresist shape used to define via holes 19, a metal layer such as tungsten is deposited via LPCVD procedures to a thickness between about 1500 to 5000 Angstroms, completely filling via holes 19. A CMP or a selective RIE procedure is then employed to remove portions of tungsten from the top surface of ILD layer 18, resulting in tungsten studs 20 in via holes 19. ILD layer 21, again a layer such as silicon oxide or FSG, is next deposited via PECVD procedures to a thickness between about 1500 to 3500 Angstroms. Photolithographic and dry etching procedures are used to define contact openings 22 in ILD layer 21, exposing top surfaces of tungsten studs 20. After removal of the photoresist shape used to define contact openings 22, a metal seed layer and a metal layer such as copper, aluminum, aluminum-copper, or tungsten is deposited, completely filling contact openings 22. Removal of portions of the metal layer from the top surface of ILD layer 21, via either a CMP procedure or a selective dry etch procedure, results in the formation of bit line or word line structures 23, in contact openings 22. The result of these procedures is schematically shown in FIG. 10.

While this invention has been particularly shown and described with reference to the preferred embodiments thereof, it will be understood by those skilled in the art that various changes in form and details may be made without departing from the spirit or scope of the invention.

What is claimed is:

1. A method of forming a capacitor device on a semiconductor substrate, comprising the steps of:

forming a shallow trench shape comprised with tapered sides, in a hard mask layer and in said semiconductor substrate, filling said shallow trench shape with a first insulator layer resulting in a shallow trench isolation (STI) region, removing a top portion of said first insulator layer from a first section of said STI region exposing a bare top portion of the tapered side of said first section of said STI region, forming a second insulator layer on said bare top portion of said tapered side of said first section of said STI region, performing an ion implantation procedure to form a capacitor region in a first portion of said semiconductor substrate located underlying said second insulator layer, and in a second portion of said semiconductor substrate located adjacent to said first portion of said semiconductor substrate, underlying a hard mask layer, removing said hard mask layer and said second insulator layer, forming a third insulator layer on said bare top portion of said tapered side in said first section of said STI region, and on top surface of said semiconductor substrate, and forming a conductive structure on a second section of said STI region, on a recessed, said first section of said STI region, and on said third insulator layer.

2. The method of claim 1, wherein said tapered sides of said shallow trench shape are comprised at an angle between about 70 to 89° in relation to a horizontal top surface of said semiconductor substrate.

3. The method of claim 1, wherein said first insulator layer is a silicon oxide layer, deposited to a thickness between about 4000 to 8000 Angstroms via a high density plasma (HDP) deposition procedure.

4. The method of claim 1, wherein the thickness of said first insulator removed from said top portion of said first section of said STI region is between about 1000 to 3500 Angstroms.

5. The method of claim 1, wherein said second insulator layer is a silicon oxide-layer obtained at a thickness between about 50 to 300 Angstroms via thermal oxidation procedures.

6. The method of claim 1, wherein said ion implantation procedure, used to form said capacitor region, is performed using boron or $BF_2$ ions, at an energy between about 3 to 30 KeV, and at a dose between about 1E13 to 5E15 atoms/cm$^2$.

7. The method of claim 1, wherein said third insulator layer is a silicon dioxide layer obtained at a thickness between about 10 to 100 Angstroms, via thermal oxidation procedures.

8. The method of claim 1, wherein said conductive structure, formed on said second section of said STI region, on the recessed first section of said STI region, and on said third insulator layer, is comprised of polysilicon.

9. A method of forming a capacitor device on a semiconductor substrate, comprising the steps of,
    forming a hard mask layer on said semiconductor substrate, comprised of a silicon nitride layer on an underlying silicon oxide layer;
    forming a shallow trench shape comprised with tapered sides in said hard mask layer and in said semiconductor substrate,
    forming a liner layer on all surfaces of said shallow trench shape;
    depositing a silicon oxide layer completely filling said shallow trench shape, resulting in a shallow trench isolation (STI) region,
    performing a capacitor patterning procedure removing a top portion of said silicon oxide layer located in a first section of said STI region and removing a top portion of said liner layer exposing a bare top portion of the tapered side in a recessed, said first section of said STI region,
    forming a screen oxide layer on said bare top portion of said tapered side in the recessed, said first section of said STI region,
    performing an ion implantation procedure to form a capacitor region in a first portion of said semiconductor substrate located underlying said screen oxide layer, and in a second portion of said semiconductor substrate located adjacent to said first portion of said semiconductor substrate, underlying said hard mask layer,
    performing a planarization procedure resulting in a smooth top surface comprised of top surfaces of said STI region and of said hard mask layer,
    removing said hard mask layer and said screen oxide layer,
    forming a capacitor dielectric layer on said bare top portion of said tapered side in said first section of said STI region, and on top surface of said semiconductor substrate, and
    forming a conductive structure on a second section of said STI region, on the recessed, said first section of said STI region, and on said capacitor dielectric layer.

10. The method of claim 9, wherein said tapered sides of said shallow trench shape are comprised at an angle between about 70 to 89° in relation to a horizontal top surface of said semiconductor substrate.

11. The method of claim 9, said liner layer is a silicon oxide layer obtained at a thickness between about 50 to 300 Angstroms via thermal oxidation procedures.

12. The method of claim 9, wherein said silicon oxide layer, used to fill said shallow trench shape, is deposited to a thickness between about 4000 to 8000 Angstroms via a high density plasma (HDP) deposition procedure.

13. The method of claim 9, wherein said capacitor patterning procedure is accomplished via photolithographic and reactive ion etching (RIE) procedures, using CHF, as an etchant for said silicon oxide layer and for said liner layer.

14. The method of claim 9, wherein the depth of recess in said first section of said STI region is between about 1000 to 3500 Angstroms.

15. The method of claim 9, wherein said screen oxide layer is a silicon oxide layer, obtained at a thickness between about 50 to 300 Angstroms via thermal oxidation procedures.

16. The method of claim 9, wherein said ion implantation procedure used to form said capacitor region, is performed using boron or BF2 ions at an energy between about 3 to 30 KeV, and at a dose between about 1E13 to 5E15 atoms/cm$^2$.

17. The method of claim 9, wherein said capacitor dielectric layer is a silicon dioxide layer obtained at a thickness between about 10 to 100 Angstroms, via thermal oxidation procedures.

18. The method of claim 9, wherein said conductive structure formed on said second section of said STI region, on recessed, first section of said STI region, and on said third insulator layer, is a doped polysilicon structure.

* * * * *